(12) United States Patent
Leobandung (10) Patent No.: US 9,941,118 B2
(45) Date of Patent: Apr. 10, 2018

(54) DENSE VERTICAL NANOSHEET (71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/243,052

(22) Filed: Aug. 22, 2016

(65) Prior Publication Data

US 2018/0053651 A1 Feb. 22, 2018

(51) Int. Cl.
| | |
|---|---|
| H01L 21/82 | (2006.01) |
| H01L 21/33 | (2006.01) |
| H01L 21/76 | (2006.01) |
| H01L 21/02 | (2006.01) |
| H01L 21/308 | (2006.01) |
| H01L 21/306 | (2006.01) |
| H01L 21/762 | (2006.01) |
| H01L 29/66 | (2006.01) |

(52) U.S. Cl.
CPC .. *H01L 21/02603* (2013.01); *H01L 21/02609* (2013.01); *H01L 21/3085* (2013.01); *H01L 21/30608* (2013.01); *H01L 21/76224* (2013.01); *H01L 29/66553* (2013.01); *H01L 29/66795* (2013.01)

(58) Field of Classification Search
CPC ......... H01L 21/02; H01L 21/30; H01L 21/76; H01L 29/66; H01L 21/82; H01L 21/33

USPC ......... 438/280–284, 142, 143, 623; 257/401, 257/345, E21.431, E21.404
See application file for complete search history.

(56) References Cited

U.S. PATENT DOCUMENTS

| | | | | |
|---|---|---|---|---|
| 5,283,208 A | * | 2/1994 | Lorsung | H01L 21/0337 257/E21.038 |
| 7,560,358 B1 | * | 7/2009 | Kim | H01L 21/823828 257/E21.085 |
| 7,915,160 B1 | * | 3/2011 | Tabery | H01L 21/0337 257/632 |
| 9,093,550 B1 | * | 7/2015 | Zhao | H01L 21/82 |
| 2010/0065862 A1 | * | 3/2010 | Ray | B82Y 20/00 257/88 |
| 2010/0320525 A1 | * | 12/2010 | Nagashima | H01L 27/11568 257/324 |
| 2012/0001229 A1 | * | 1/2012 | Zhu | B82Y 10/00 257/192 |
| 2013/0158378 A1 | * | 6/2013 | Berger | A61B 5/14546 600/348 |
| 2013/0252420 A1 | * | 9/2013 | Sandhu | H01L 21/0337 438/666 |
| 2014/0120691 A1 | * | 5/2014 | Lee | H01L 21/76 438/400 |

(Continued)

*Primary Examiner* — Sheikh Maruf
(74) *Attorney, Agent, or Firm* — Scully, Scott, Murphy & Presser, P.C.; Louis J. Percello, Esq.

(57) ABSTRACT

After forming a sacrificial mandrel located over a substrate, alternating channel layer portions and sacrificial layer portions are formed on sidewalls of the sacrificial mandrel by epitaxial growth of alternating layers of a channel material and a sacrificial material followed by planarization. The sacrificial mandrel and the sacrificial layer portions are sequentially removed, leaving channel layer portions extending upwards from the substrate.

18 Claims, 5 Drawing Sheets

(56) References Cited

U.S. PATENT DOCUMENTS

| | | | | |
|---|---|---|---|---|
| 2014/0151757 A1* | 6/2014 | Basu | ................. | B82Y 40/00 257/288 |
| 2014/0220767 A1* | 8/2014 | Hu | ................. | H01L 29/66545 438/585 |
| 2014/0239363 A1* | 8/2014 | Pan | ................. | H01L 27/0629 257/306 |
| 2015/0170961 A1* | 6/2015 | Romero | ............. | H01L 21/76838 438/641 |
| 2015/0325436 A1* | 11/2015 | Bentley | ................. | H01L 29/66 257/401 |
| 2016/0118472 A1* | 4/2016 | Qi | ................. | H01L 29/66553 438/283 |
| 2016/0133727 A1* | 5/2016 | Hashemi | ............. | H01L 29/66795 257/288 |
| 2016/0172358 A1* | 6/2016 | Hatcher | ............. | H01L 29/42392 257/401 |
| 2016/0204002 A1* | 7/2016 | Wallace | ............. | H01L 21/76897 257/773 |
| 2016/0211322 A1* | 7/2016 | Kim | ................. | H01L 29/66795 |
| 2016/0240630 A1* | 8/2016 | Seong | ............. | H01L 29/66545 |
| 2017/0133375 A1* | 5/2017 | Fung | ................. | H01L 21/82380 |

\* cited by examiner

DENSE VERTICAL NANOSHEET

BACKGROUND

The present application relates to semiconductor device fabrication, and more particularly to the fabrication of dense semiconductor features including semiconductor fins/nanowires using epitaxy growth.

With the continuing trend towards miniaturization of integrated circuits (ICs), there is a need for transistors with increasingly smaller dimensions. Fin field effect transistor (FinFET) and nanowire FET architectures are becoming more prevalent as device size continues to shrink.

Making dense features such as semiconductor fins or nanowires for FinFETs or nanowire FETs is challenging. Photolithography is reaching its limit. With current immersion lithographic techniques using 193 nm light, a minimum pitch size between features is about 80 nm. Side image transfer (SIT) and direct self-assembly (DSA) have been developed to create features with widths substantially smaller than the minimum size allowed by a given lithographic process. However, SIT and DSA processes are limited in the density of structures that they can provide. Therefore, there remains a need for the fabrication of dense features for FinFETs or nanowire FETs.

SUMMARY

The present application provides a method of forming dense semiconductor fins/nanowires using epitaxy growth. After forming a sacrificial mandrel located over a substrate, alternating channel layer portions and sacrificial layer portions are formed on sidewalls of the sacrificial mandrel by epitaxial growth of alternating layers of a channel material and a sacrificial material followed by planarization. The sacrificial mandrel and the sacrificial layer portions are sequentially removed, leaving channel layer portions extending upwards from the substrate.

In one aspect of the present application, a method of forming a semiconductor structure is provided. After forming a sacrificial mandrel extending upwards from a substrate, alternating channel layer portions and sacrificial layer portions are formed on sidewalls of the sacrificial mandrel. The sacrificial mandrel is removed followed by removing the sacrificial layer portion. The channel layer portions remain extending upwards from the substrate.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figures 1, 2:
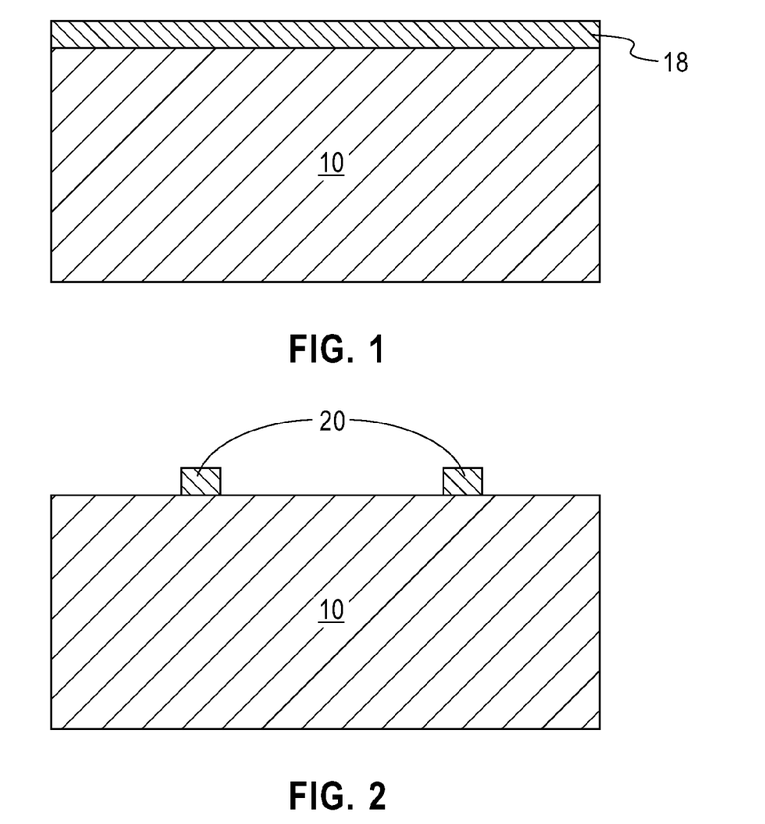
FIG. 1 is a cross-sectional view of an exemplary semiconductor structure including a hard mask layer formed over a semiconductor substrate according to an embodiment of the present application.
FIG. 2 is a cross-sectional view of the exemplary semiconductor structure of FIG. 1 after patterning the hard mask layer to form a plurality of hard mask caps.

Referring to FIG. 1, an exemplary semiconductor structure that can be employed in one embodiment of the present application includes a hard mask layer 18 formed over a semiconductor substrate 10. In one embodiment and as shown, the semiconductor substrate 10 is a bulk semiconductor substrate including a semiconductor material throughout. The bulk semiconductor substrate may be formed from a semiconductor material such as silicon. In one embodiment, the bulk semiconductor substrate includes a single crystalline material such as single crystalline silicon. The thickness of the bulk semiconductor substrate can be from 30 μm to about 2 mm, although lesser and greater thicknesses can also be employed. In another embodiment, the semiconductor substrate 10 is a semiconductor-on-insulator (SOI) substrate including a stack of, from bottom to top, a handle substrate and a buried insulator layer and a top semiconductor layer (not shown separately).

The hard mask layer 18 is formed on a top surface of the semiconductor substrate 10. The hard mask layer 18 may include a dielectric material such as silicon nitride, silicon oxide, silicon oxynitride or a combination thereof. In one embodiment, the hard mask layer 18 is composed of silicon nitride. In one embodiment, the hard mask layer 18 can be formed by a deposition process such as, for example, chemical vapor deposition (CVD) or plasma enhanced chemical vapor deposition (PECVD). In another embodiment, the hard mask layer 18 can be formed by converting a surface portion of the semiconductor substrate 10 into a dielectric material using thermal conversion or plasma conversion. The thickness of the hard mask layer 18 can be from 20 nm to 100 nm, although lesser and greater thicknesses can also be employed.

Referring to FIG. 2, the hard mask layer 18 is patterned to form a plurality of hard mask caps 20. Specifically, a photoresist layer (not shown) can be applied over a top surface of the hard mask layer 18 and lithographically patterned to define a set of areas covered by a patterned photoresist layer. The hard mask layer 18 is then etched by an anisotropic etch using the patterned photoresist layer as an etch mask. In one embodiment, a dry etch such as, for example, reactive ion etch (RIE) can be used. In another embodiment, a wet etch using a chemical etchant can be used. In still a further embodiment, a combination of dry etch and wet etch can be used. Remaining portions of the hard mask layer 18 constitutes the hard mask caps 20. After formation of the hard mask caps 20, the patterned photoresist layer can be removed, for example, by ashing.

Figure 3:
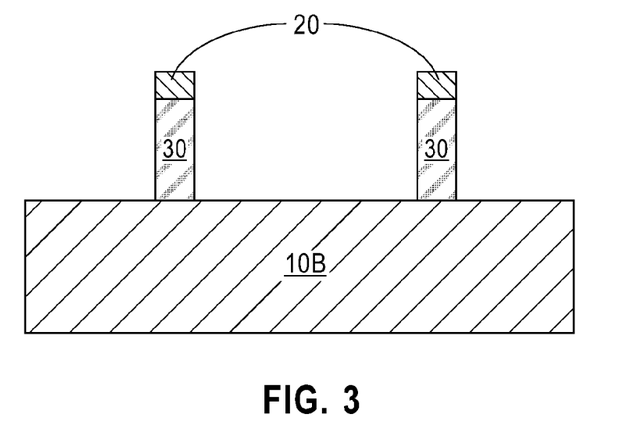
FIG. 3 is a cross-sectional view of the exemplary semiconductor structure of FIG. 2 after patterning an upper portion of the semiconductor substrate to provide a plurality of sacrificial mandrels.

Referring to FIG. 3, an upper portion of the semiconductor substrate 10 is patterned to provide a plurality of sacrificial mandrels 30 extending upwards from a remaining portion of the semiconductor substrate 10. The remaining portion of the semiconductor substrate 10 is herein referred to as a base substrate 10B. In instances where the semiconductor substrate 10 is a SOI substrate, the top semiconductor layer is patterned to provide the sacrificial mandrels 30 and the buried insulator layer constitutes the base substrate 10B.

The upper portion of the semiconductor substrate 10 can be etched by an anisotropic etch using the hard mask caps 20 as an etch mask. The anisotropic etch can be a dry etch such as, for example, RIE or a wet etch that removes the exposed portions of the semiconductor substrate 10. In one embodiment, a wet etch using, for example, tetramethylammonium hydroxide (TMAH) is performed to form sacrificial mandrels 30 having (111) sidewall surfaces. After etching, each sacrificial mandrel 30 is still capped with a hard mask cap 20.

Each sacrificial mandrel 30 that is formed includes a pair of vertical sidewalls that are parallel to each other. The width of each sacrificial mandrel 30 is typically greater than a minimum feature size that may be formed using a specific lithographic technique. In one embodiment, the width of each sacrificial mandrel 30 is from 8 nm to 30 nm, although lesser and greater widths can also be employed. Each sacrificial mandrel 30 may be separated from its nearest neighboring sacrificial mandrel 30 by a distance (i.e., spacing) that is from 40 nm to 200 nm. Other spacings that are less than, or greater than the aforementioned spacing range may also be used in the present application.

Figure 4:
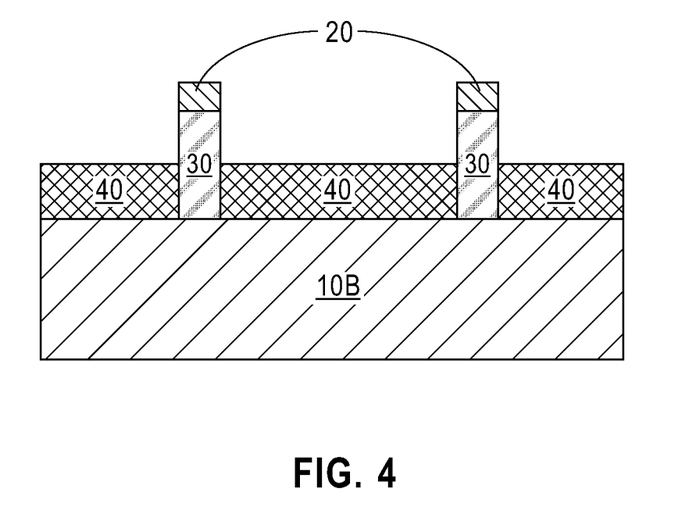
FIG. 4 is a cross-sectional view of the exemplary semiconductor structure of FIG. 3 after forming a dielectric material layer around bottom portions of the sacrificial mandrels.

Referring to FIG. 4, a dielectric material layer 40 is formed around bottom portions of the sacrificial mandrels 30; in some embodiments such as with SOI substrate, the dielectric material layer 40 can be omitted. As is shown, the height of the dielectric material layer 40 is less than the height of each sacrificial mandrel 30 such that upper sidewalls and top surfaces of the sacrificial mandrels 30 are exposed. The height of the portion of each sacrificial mandrel 30 located above the top surface of the dielectric material layer 40 (or above the buried insulator layer if the sacrificial mandrels 30 are formed from an SOI substrate) can be from 10 nm to 200 nm, although lesser and greater heights can also be employed.

The dielectric material layer 40 can be formed by first depositing a dielectric material over and between the sacrificial mandrels 30 using a deposition process, such as, for example, CVD or PVD. The dielectric material that provides the dielectric material layer 40 may include a dielectric oxide or a dielectric nitride. In one embodiment, the dielectric material layer 40 is comprised of silicon dioxide. The deposited dielectric material can then be planarized by a planarization technique such as, for example chemical mechanical planarization (CMP) followed by an etch back process to etch the deposited dielectric material to the desired thickness. An anisotropic etch such as, for example, RIE may be employed to remove the dielectric material of the dielectric material layer 40 selective to the semiconductor material of the sacrificial mandrels 30 and the dielectric material of the hard mask caps 20.

Figure 5:
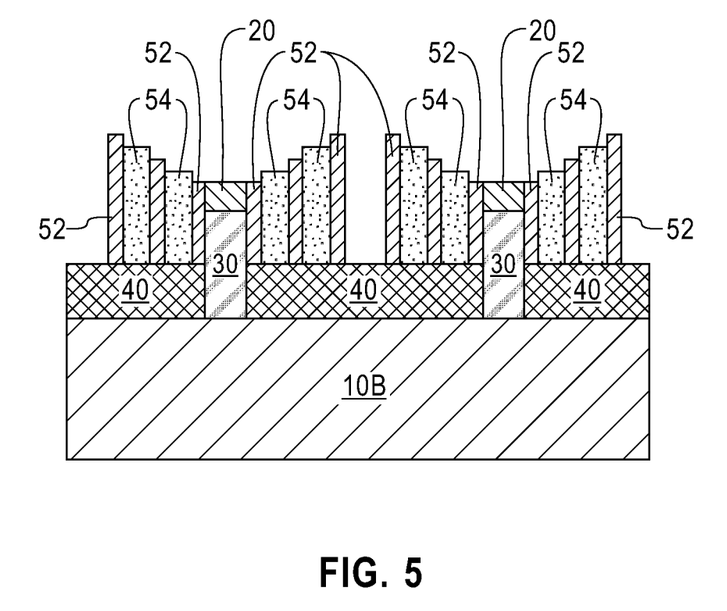
FIG. 5 is a cross-sectional view of the exemplary semiconductor structure of FIG. 4 after forming alternating channel layers and sacrificial layers on sidewalls of the sacrificial mandrels.

Referring to FIG. 5, alternating layers of a channel material (herein referred to as channel layers 52) and a sacrificial material (herein referred to as sacrificial layers 54) are formed on sidewalls of the sacrificial mandrels 30. In one embodiment and as shown, the alternating layers 52, 54 can be formed having channel layers 52 in direct contact with the sidewall surfaces of sacrificial mandrels 30. Alternatively, the alternating layers 52, 54 can also be formed having sacrificial layers 54 in direct contact with the sidewall surfaces of sacrificial mandrels 30.

The channel material, which will eventually form semiconductor fins or nanowires is different from the sacrificial material. Each of the channel material and the sacrificial material can be independently selected from a III-V compound semiconductor material, which can be one of InSb, InP, InN, InGaSb, InGaP, InGaN, InGaAsSb, InGaAsP, InGaAsN, InGaAs, InAsSbP, InAsSb, InAs, InAlAsN, GaSb, GaP, GaN, GaInNAsSb, GaInAsSbP, GaAsSbN, GaAsSb, GaAsP, GaAsN, GaAs, BP, BN, BN, BAs, AlSb, AlP, AlN, AlInSb, AlInAsP, AlInAs, AlGaP, AlGaN, AlGaInP, AlGaAsP, AlGaAsN, AlGaAs, and AlAs. Alternatively, each of the channel semiconductor material and the sacrificial material can be independently selected from elemental semiconductor materials, which include silicon, germanium, a silicon-germanium alloy, a silicon-carbon alloy, and a silicon-germanium-carbon alloy. Yet alternately, one of the channel material and the sacrificial material can be a III-V compound semiconductor material, and the other of the channel material and the sacrificial material can be an elemental semiconductor material or an alloy of at least two elemental semiconductor materials. As used herein, an elemental semiconductor material refers to silicon, germanium, and carbon. In one embodiment, each of the channel layers 52 may include InGaAs, and each of the sacrificial 1 layers 54 may include InAlAs, InP or AlAs.

The channel layers 52 and the sacrificial layers 54 may be formed utilizing an epitaxial growth (or deposition) process. The term "epitaxial growth or deposition" means the growth of a semiconductor material on a deposition surface of a semiconductor material, in which the semiconductor material being grown has the same crystalline characteristics as the semiconductor material of the deposition surface. For example, an epitaxial semiconductor material deposited on a (100) surface will take on a (100) orientation. Thus, in the present application, each of the channel layers 52 and the sacrificial layers 54 is epitaxial aligned with (i.e., having same crystalline structure as) the underlying layer. In one embodiment and when the sidewall surfaces of the sacrificial mandrels 30 have a (111) surface orientation, each of the channel layers 52 and the sacrificial layer 54 formed thereon also has a (111) surface orientation.

The channel layers 52 and the sacrificial layers 54 can be formed, for example, by CVD and molecular beam epitaxy (MBE). The semiconductor material that provides each of the channel layers 52 and the sacrificial layers 54 grows only on exposed semiconductor surfaces, i.e., the sidewall surfaces of the sacrificial mandrels 30 and a surface of each underlying layer which can be a channel layer 52 or a sacrificial layer 54 once formed and does not grow on the dielectric surfaces, such as surfaces of the dielectric material layer 40 and the hard mask caps 20. The channel layers 52 and the sacrificial layers 54 thus formed extend upwards from the top surface of the dielectric material layer 40. Each of epitaxially grown channel layers 52 and sacrificial layers 54 typically has a thickness less than a minimum feature size that can be formed using a specific lithographic technique. In one embodiment, the thickness of each channel layer 52, as measured at its base, can be from 2 nm to 10 nm, and the thickness of each sacrificial layer 54, as measured at its base, can be from 5 nm to 30 nm, although lesser and greater thicknesses can also be employed.

Figure 6:
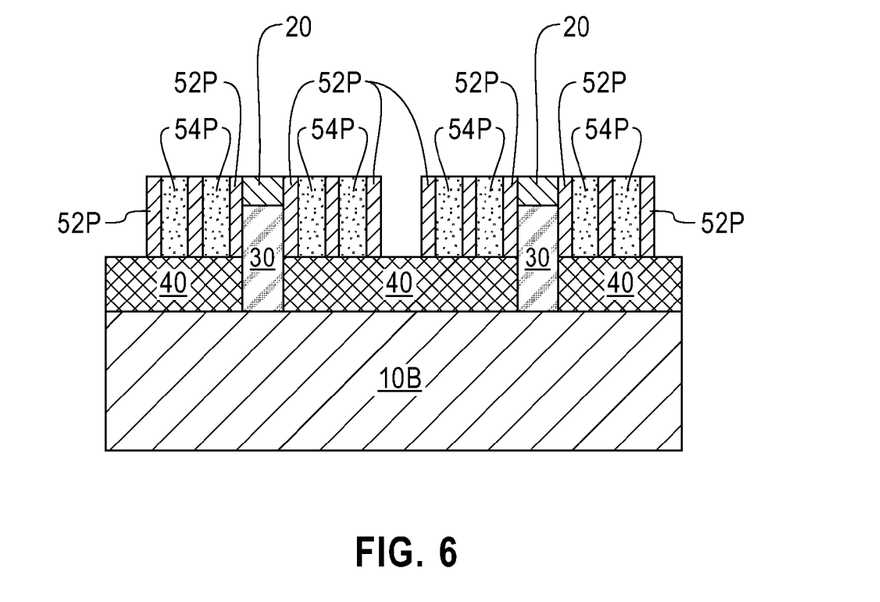
FIG. 6 is a cross-sectional view of the exemplary semiconductor structure of FIG. 5 after removing portions of the channel layers and the sacrificial layers that are located above top surfaces of the hard mask caps to provide alternating channel layer portions and sacrificial layer portions.

Referring FIG. 6, portions of the channel layers 52 and the sacrificial layers 54 that are located above top surfaces of the hard mask caps 20 are removed, for example, by CMP. A remaining portion of each channel layer 52 is herein referred to as a channel layer portion 52P, and a remaining portion of each sacrificial layer 54 is herein referred to as a sacrificial layer portion 54P. Top surfaces of the channel layer portions 52P and the sacrificial layer portions 54P are coplanar with the top surfaces of the hard mask caps 20.

Figure 7:
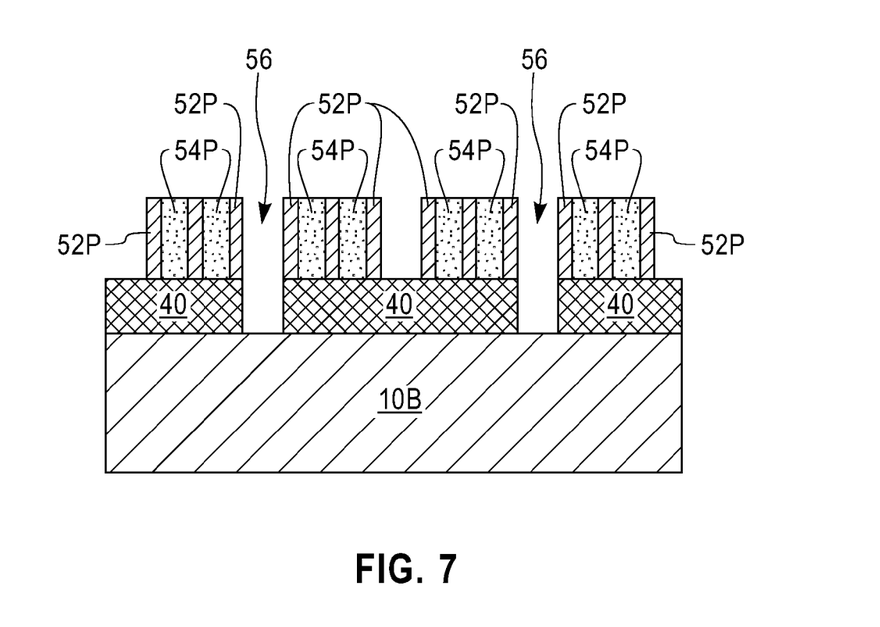
FIG. 7 is a cross-sectional view of the exemplary semiconductor structure of FIG. 6 after removing the hard mask caps and the sacrificial mandrels to provide trenches.

Referring to FIG. 7, the hard mask caps 20 and the sacrificial mandrels 30 are removed from the structure by at least one etch. In one embodiment, a single etching process may be used to remove the hard mask caps 20 and the sacrificial mandrels 30. In another embodiment, separate etching processes may be performed to remove the hard mask caps 20 and the sacrificial mandrels 30. For example, a first etch can be performed to remove the hard mask caps 20. The first etch can be a dry etch and/or a wet etch that removes the dielectric material of the hard mask caps 20 selective to the semiconductor materials of the sacrificial mandrels 30, the channel layer portions 52P and the sacrificial layer portions 54P and the dielectric material of the dielectric material layer 40. In one embodiment, and when the hard mask caps 20 are composed of a nitride and the dielectric material layer 40 is composed of an oxide, a wet isotropic etch using hot phosphoric acid may be employed to remove the hard mask caps 20. Subsequently, a second etch can be performed to remove the sacrificial mandrels 30. The second etch can be a dry etch and/or a wet etch that removes the semiconductor material of the sacrificial mandrels 30 selective to the dielectric material of the dielectric material layer 40 and semiconductor materials of the channel layer portions 52P and the sacrificial layer portions 54P. A trench 56 is thus formed, occupying a volume from which each vertical stack of sacrificial mandrel 30 and hard mask cap 20 is removed.

Figure 8:
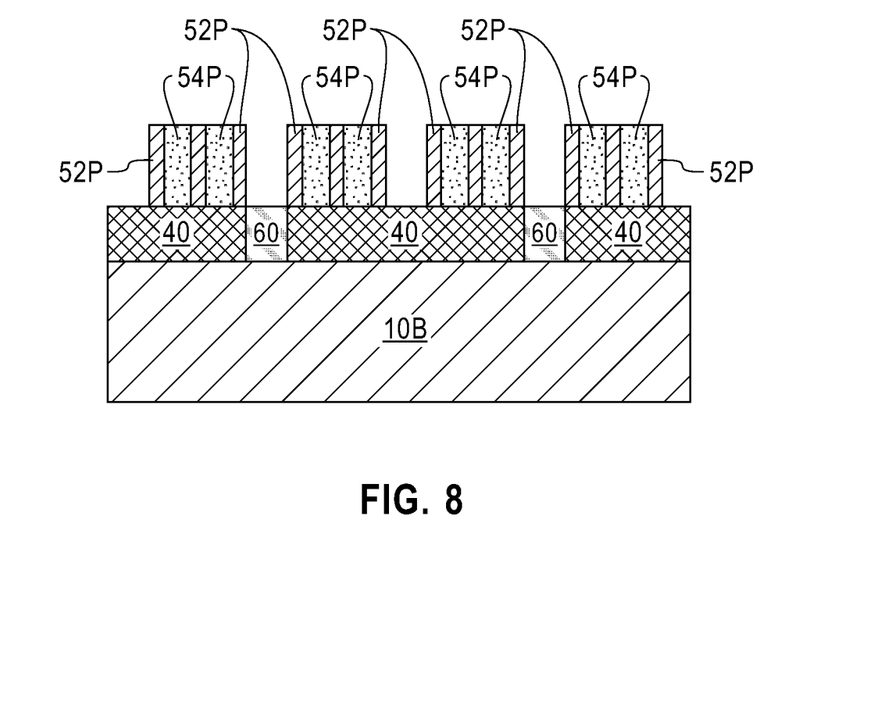
FIG. 8 is a cross-sectional view of the exemplary semiconductor structure of FIG. 7 after forming a trench isolation structure in a bottom portion of each trench.

Referring to FIG. 8, a trench isolation structure 60 is formed in a bottom portion of each trench 56. The trench isolation structures 60 can be formed by first depositing a trench dielectric material in the trenches 56 using a deposition process, such as, for example, CVD or PVD. The trench dielectric material that provides the trench isolation structures 60 can be the same as or, different from, the dielectric material that provides the dielectric material layer 40. In one embodiment, each of the trench isolation structures 60 and the dielectric material 40 includes silicon dioxide. Subsequently, planarization and/or a recess etch may be performed to provide the trench isolation structures 60. In some embodiments of the present application, the trench dielectric material only partially fills the bottom portions of the trenches 56 and as such, planarization is not needed. In such case, a recess etch may, or may not, be needed to provide the trench isolation structures 60. As shown, each trench isolation structure 60 that is provided has a top surface coplanar with the top surface of the dielectric material layer 40. The dielectric material layer 40 and the trench isolation structures 60 together constitute an insulator layer that electrically insulates the channel layer portions 52 from the base substrate 10B.

Figure 9:
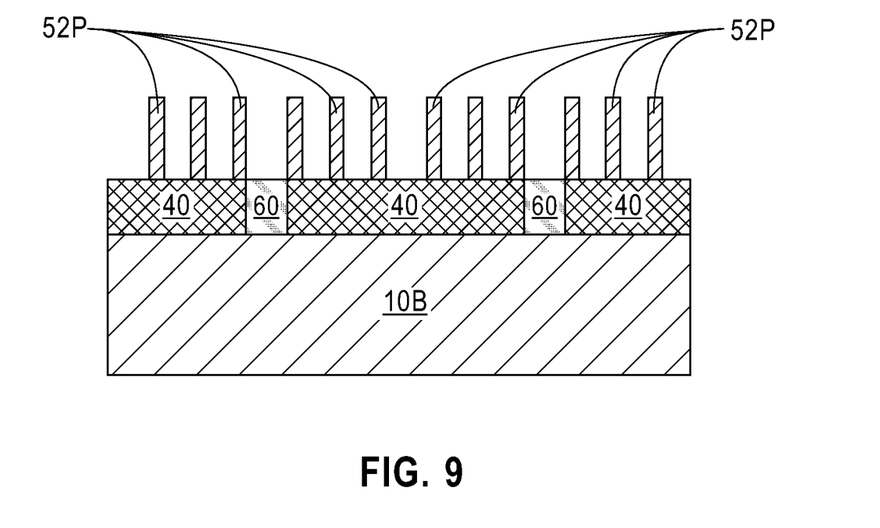
FIG. 9 is a cross-sectional view of the exemplary semiconductor structure of FIG. 8 after removing the sacrificial layer portions.

Referring to FIG. 9, the sacrificial layer portions 54P are removed, leaving the channel layer portions 52P extending upwards from the top surface of insulator layer (40, 60). The removal of the sacrificial layer portions 54P can be performed, for example, by an etch that moves the semiconductor material providing the sacrificial layer portions 54P, without affecting the semiconductor material providing the channel layer portions 52P and the dielectric material providing the trench isolation structures 60 and the dielectric material layer 40.

The channel layer portions 50 constitute a plurality of semiconductor fins extending upwards from the insulator layer (40, 60). In some embodiments of the present application, the channel layer portion 50 may be smoothed to form a plurality of nanowires. The smoothing of the channel layer portions 50 can be performed, for example, by annealing the channel layer portions 50 in hydrogen.

The width of each channel layer portions 52P is determined by the thickness of each channel layer 52. The spacing between adjacent channel layer portions 52P is determined by the thickness of each sacrificial layer 54. Thus, in the present application, the width of each channel layer portions 52P can be adjusted by controlling the thickness of each channel layer 52, while the spacing between adjacent channel layer portions 52P can be adjusted by controlling the thickness of each sacrificial layer 54. Since the channel layers 52 and the sacrificial layers 54 are epitaxially grown and the thickness of each of the channel layers 52 and the sacrificial layers 54 can be selected to be less than a minimum feature size that can be formed using a specific lithographic technique, dense fin/nanowire structures can be formed in the present application.

Figure 10:
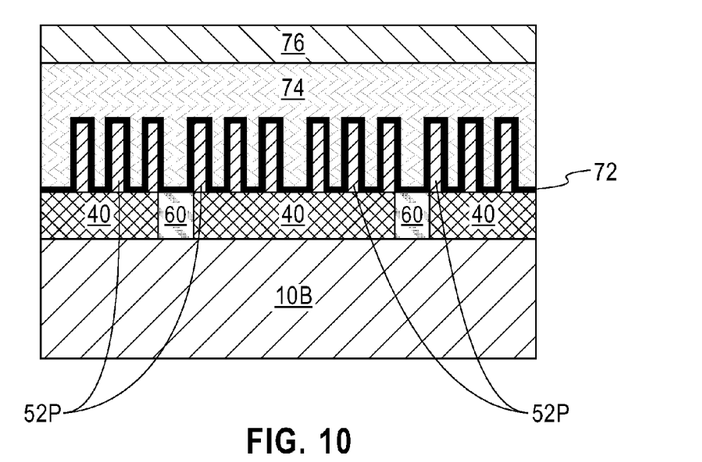
FIG. 10 is a cross-sectional view of the exemplary semiconductor structure of FIG. 9 forming a gate structure straddling a portion of each channel layer portion and forming source/drain regions on portions of each channel layer portion located on opposite sides of the gate structure.
Figure 10A:
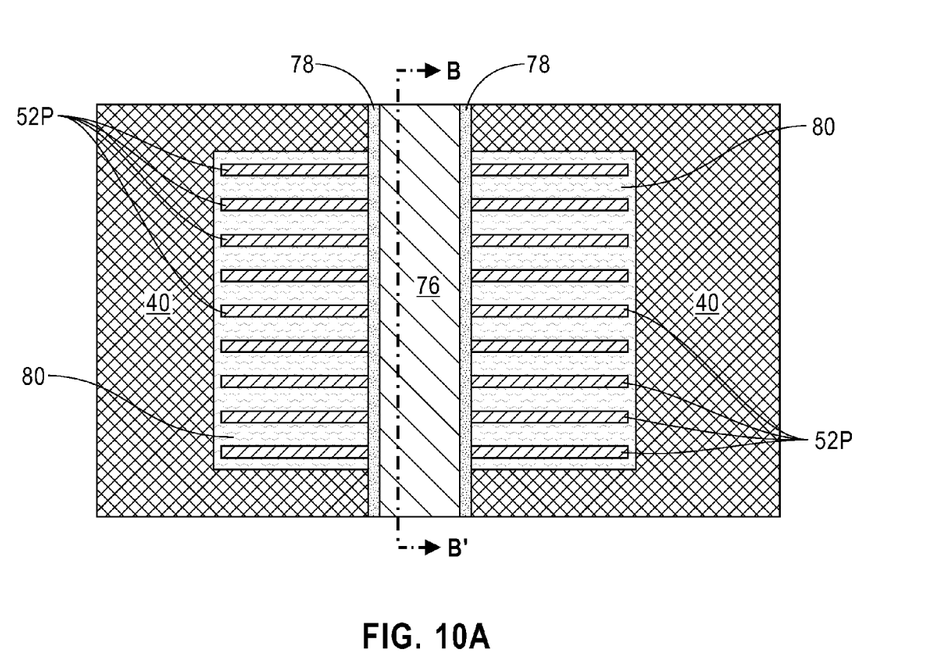
FIG. 10A is a top-down view of the exemplary semiconductor structure of FIG. 10.

Referring to FIGS. 10 and 10A, a gate stack is formed on (and straddling) a portion of each of the channel layer portions 52P. The gate stack includes at least a gate dielectric 72 and a gate electrode 74. The gate stack may optionally include a gate cap 76. The gate stack (72, 74, 76) may be formed by deposition and patterning of gate stack layers. The patterning of the gate stack layers can be effected by application of a photoresist layer (not shown), lithographic patterning of the photoresist layer, transfer of the pattern in the photoresist layer into the gate stack layers, and removal of the patterned photoresist layer, for example, by ashing. In one embodiment, the materials of the gate stack (72, 74, 76) can be sacrificial materials that are subsequently removed, and are replaced with another gate stack including a functional gate dielectric and a functional gate electrode after doped epitaxial semiconductor material is formed that provides source and drain regions of FETs.

The gate dielectric 72 can include silicon oxide, silicon nitride, silicon oxynitride, or a combination thereof. Alternately or additionally, the gate dielectric 72 can include a high dielectric constant (high-k) dielectric material having a dielectric constant greater than 8.0. Exemplary high-k dielectric materials include, but are not limited to, $HfO_2$, $ZrO_2$, $La_2O_3$, $Al_2O_3$, $TiO_2$, $SrTiO_3$, $LaAlO_3$ or $Y_2O_3$. The gate dielectric 72 can have a thickness from 1 nm to 10 nm, although lesser and greater thicknesses can also be employed.

The gate electrode 74 includes a conductive material. Conductive materials that can be employed for the gate electrode 74 include, but are not limited to, doped semiconductor materials such as, for example, doped polysilicon and metallic materials such as, for example, tungsten, titanium, tantalum, aluminum, nickel, ruthenium, palladium, platinum, or alloys thereof. The gate electrode 74 can have a thickness from 10 nm to 100 nm, although lesser and greater thicknesses can also be employed.

The gate cap 76, if employed, can be comprised of a dielectric material including, for example, silicon oxide, silicon nitride, silicon oxynitride, or multilayer stacks thereof. When present, the gate cap 76 can have a thickness from 20 to 100 nm, although lesser and greater thicknesses can also be employed.

A gate spacer 78 can be formed on sidewalls of the gate stack (72, 74, 76). The gate spacer 78 can be formed, for example, by deposition of a conformal dielectric material layer and selective removal of horizontal portions of the deposited conformal dielectric material layer. The remaining vertical portions of the deposited conformal dielectric material layer constitute the gate spacer 78. The gate spacer 78 may be composed of silicon oxide, silicon nitride, silicon oxynitride, or combinations thereof. The width of the gate spacer 78, as measured at the base, can be from 2 nm to 50 nm, although lesser and greater widths can also be employed.

The gate stack (72, 74, 76) and the gate spacer 78 that laterally surrounds the gate stack (72, 74, 76) constitute a gate structure.

A source region and a drain region (collectively referred to as source/drain regions 80) are subsequently formed on portions of each channel layer portion 52 located on opposite sides of the gate structure (72, 74, 76, 78). In one embodiment and as shown in FIG. 10A, the source/drain regions 80 include raised source/drain regions that merge portions of the channel layer portions 52 exposed by the gate structure (72, 74, 76, 78). The raised source/drain regions may be formed by selective epitaxial growth. During the selective epitaxial growth process, the deposited semiconductor material grows only on exposed semiconductor surfaces, i.e., the top surface and sidewall surfaces of portions of the channel layer portions 52 located on opposite sides of the gate structure (72, 74, 76, 78) and does not grow on dielectric surfaces, such as surfaces of the gate cap 76, the gate spacer 78 and the insulator layer (40, 60).

The semiconductor material (i.e., silicon-containing semiconductor material and germanium-containing semiconductor material) of the raised source/drain regions can be deposited as an intrinsic semiconductor material, or can be deposited with in-situ doping. If the semiconductor material is deposited as an intrinsic semiconductor material, the raised source/drain regions can be subsequently doped (ex-situ) utilizing ion implantation, gas phase doping or dopant out diffusion from a sacrificial dopant source material. For n-type FETs, the raised source/drain regions can be doped with an n-type dopant, while for p-type FETs, the raised source/drain regions can be doped with a p-type dopant. The term "p-type" refers to the addition of impurities to an intrinsic semiconductor that creates deficiencies of valence electrons. Examples of p-type dopants, i.e., impurities, include, but are not limited to, boron, aluminum, gallium and indium. The term "n-type" refers to the addition of impurities that contributes free electrons to an intrinsic semiconductor. Examples of n-type dopants, i.e., impurities, include, but are not limited to, antimony, arsenic and phosphorous. In one embodiment and if ex-situ doping is employed, the ion implantation or gas phase doping also introduce dopants into portions of the channel layer portions 52P that do not underlie the gate stack (72, 74, 76). The resulting doped portions (not shown) within each channel layer portion 52P constitute planar source/drain regions. In another embodiment and if in-situ doping is employed, an anneal process can be performed to outdiffuse the dopants from the raised source/drain regions into underlying portions of the channel layer portions 52P to form the planar source/drain regions.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
   forming a sacrificial mandrel extending upwards from a substrate;
   forming alternating channel layer portions and sacrificial layer portions on sidewalls of the sacrificial mandrel, wherein the alternating channel layer portions and sacrificial layer portions are arranged side-by-side and extend in an upward direction away from the substrate;
   wherein the alternating channel layer portions and sacrificial layer portions also contact sidewalls of a hard mask cap that is located atop the sacrificial mandrel;
   wherein the forming the sacrificial mandrel comprises:
      forming a hard mask layer on a semiconductor substrate;
      patterning the hard mask layer to form the hard mask cap; and
      patterning an upper portion of the semiconductor substrate using the hard mask cap as an etch mask to provide the sacrificial mandrel;
   removing the sacrificial mandrel; and
   removing the sacrificial layer portions, while maintaining the channel layer portions extending upwards in the upward direction away from the substrate.

2. The method of claim 1, wherein each of the channel layer portions has a thickness ranging from 2 nm to 10 nm, and each of the sacrificial layer portions has a thickness ranging from 5 nm to 30 nm.

3. The method of claim 1, wherein the semiconductor substrate is a bulk semiconductor substrate.

4. The method of claim 1, wherein the semiconductor substrate is a semiconductor-on-insulator (SOI) substrate, wherein the patterning the upper portion of the semiconductor substrate patterns a top semiconductor layer in the SOI substrate.

5. The method of claim 1, wherein the patterning the upper portion of the semiconductor substrate is performed by an anisotropic etch.

6. The method of claim 1, wherein the anisotropic etch is a wet etch using tetramethylammonium hydroxide (TMAH).

7. The method of claim 1, wherein each of the sidewalls of the sacrificial mandrel has a (111) surface orientation.

8. The method of claim 1, further comprising forming a dielectric material layer around a bottom portion of the sacrificial mandrel, wherein the alternating channel layer portions and sacrificial layer portions are formed extending upwards from a top surface of the dielectric material layer.

9. The method of claim 1, wherein the removing the sacrificial mandrel and the hard mask cap forms a trench extending through the dielectric material layer.

10. The method of claim 1, further comprising forming a trench isolation structure within a bottom portion of the trench, wherein the trench isolation structure has a top surface coplanar with the top surface of the dielectric material layer.

11. The method of claim 2, wherein the forming the alternating channel layer portions and sacrificial layer portions comprises:
    epitaxially depositing alternating channel layers and sacrificial layers on the sidewalls of the sacrificial mandrel and the hard mask cap; and
    removing portions of the channel layers and the sacrificial layers that are located above a top surface of the hard mask cap.

12. The method of claim 11, wherein one of the channel layers is in direct contact with the sidewalls of the sacrificial mandrel.

13. The method of claim 11, wherein one of the sacrificial layers is in direct contact with the sidewalls of the sacrificial mandrel.

14. The method of claim 11, wherein each of the channel layers comprises InGaAs, and each of the sacrificial layers comprises InAlAs, InP or AlAs.

15. The method of claim 1, further comprising forming a gate stack over a portion of each of the channel layer portions.

16. The method of claim 15, further comprising forming a gate spacer on sidewalls of the gate stack.

17. The method of claim 16, further comprising forming source/drain regions on portion of the channel layer portions that are not covered by the gate stack, wherein the source/drain regions merge the channel layer portions.

18. A method of forming a semiconductor structure comprising:
    forming a sacrificial mandrel extending upwards from a substrate, wherein the forming the sacrificial mandrel comprises:
        forming a hard mask layer on a semiconductor substrate;
        patterning the hard mask layer to form the hard mask cap; and
        patterning an upper portion of the semiconductor substrate using the hard mask cap as an etch mask to provide the sacrificial mandrel;
    forming alternating channel layer portions and sacrificial layer portions on sidewalls of the sacrificial mandrel, wherein the alternating channel layer portions and sacrificial layer portions also contact sidewalls of the hard mask cap that is located atop the sacrificial mandrel;
    removing the sacrificial mandrel; and
    removing the sacrificial layer portion, while maintaining the channel layer portions extending upwards from the substrate.

* * * * *